(12) United States Patent
Chou et al.

(10) Patent No.: US 12,148,685 B2
(45) Date of Patent: Nov. 19, 2024

(54) REDISTRIBUTION LAYER STRUCTURE

(71) Applicant: Innolux Corporation, Miao-Li County (TW)

(72) Inventors: Hung-Sheng Chou, Miao-Li County (TW); Wen-Hsiang Liao, Miao-Li County (TW); Kuo-Jung Fan, Miao-Li County (TW); Heng-Shen Yeh, Miao-Li County (TW); Cheng-Chi Wang, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 434 days.

(21) Appl. No.: 17/530,373

(22) Filed: Nov. 18, 2021

(65) Prior Publication Data
US 2022/0189862 A1    Jun. 16, 2022

(30) Foreign Application Priority Data

Dec. 15, 2020 (CN) .......................... 202011476484.9
Nov. 12, 2021 (CN) .......................... 202111337111.8

(51) Int. Cl.
*H01L 23/498* (2006.01)
*H01L 21/48* (2006.01)
*H01L 21/683* (2006.01)

(52) U.S. Cl.
CPC .... *H01L 23/49822* (2013.01); *H01L 21/4857* (2013.01); *H01L 21/6835* (2013.01); *H01L 2221/68345* (2013.01)

(58) Field of Classification Search
CPC ...................... H01L 23/49822; H01L 21/4857
See application file for complete search history.

(56) References Cited

U.S. PATENT DOCUMENTS

| | | |
|---|---|---|
| 2018/0082962 A1 | 3/2018 | Lee et al. |
| 2020/0027804 A1* | 1/2020 | Fang ........................ H01L 24/11 |
| 2020/0098694 A1 | 3/2020 | Suk et al. |
| 2020/0273723 A1 | 8/2020 | Lee et al. |
| 2021/0098354 A1* | 4/2021 | Wu ........................ H01L 23/5385 |
| 2022/0084993 A1* | 3/2022 | Kim ........................ H01L 25/105 |

* cited by examiner

*Primary Examiner* — Jay C Chang
*Assistant Examiner* — Mikka Liu
(74) *Attorney, Agent, or Firm* — JCIPRNET

(57) ABSTRACT

A redistribution layer structure is provided. The redistribution layer structure includes a first metal layer and a first dielectric layer disposed on the first metal layer. A range of a difference between a coefficient of thermal expansion of the first dielectric layer and a coefficient of thermal expansion of the first metal layer is 0% to 70% of the coefficient of thermal expansion of the first dielectric layer.

17 Claims, 2 Drawing Sheets

REDISTRIBUTION LAYER STRUCTURE

CROSS-REFERENCE TO RELATED APPLICATION

This application claims the priority benefit of China application serial no. 202011476484.9, filed on Dec. 15, 2020, and China application serial no. 202111337111.8, filed on Nov. 12, 2021. The entirety of each of the above-mentioned patent applications is hereby incorporated by reference herein and made a part of this specification.

BACKGROUND

Technical Field

This disclosure relates to a circuit structure of an electronic component, and in particular to a redistribution layer structure.

Description of Related Art

With continuous increase in the application of electronic components, new progress is seen in the development of display technology every day. With different manufacturing process conditions, higher and higher requirements are seen in the structure and quality of the electronic component, thereby causing the electronic components to face different issues. Therefore, there has to be constant renewal and modifications in the research and development of the electronic components.

SUMMARY

This disclosure provides a redistribution layer structure, which has good structural strength or quality.

According to an embodiment of the disclosure, the redistribution layer structure includes a first metal layer and a first dielectric layer. The first dielectric layer is disposed on the first metal layer. A range of a difference between a coefficient of thermal expansion of the first dielectric layer and a coefficient of thermal expansion of the first metal layer is from 0% to 70% of the coefficient of thermal expansion of the first dielectric layer.

In summary, in the redistribution layer structure according to the embodiment of the disclosure, the range of the difference between the coefficient of thermal expansion of the first dielectric layer and the coefficient of thermal expansion of the corresponding first metal layer is 0% to 70% of the coefficient of thermal expansion of the first dielectric layer. In other words, the coefficient of thermal expansion of the first dielectric layer and the coefficient of thermal expansion of the first metal layer may be close to each other and may be matching. The deformation difference between the first dielectric layer and the first metal layer due to the rising and falling temperatures during the manufacturing process may be reduced. In this way, the probability of warping between the first dielectric layer and the corresponding first metal layer may be lowered, or the probability of peeling between the first dielectric layer and the corresponding first metal layer may be reduced. The overall warpage issue of the redistribution layer structure may be improved. The redistribution layer structure can have good reliability, structural strength, or quality. The redistribution layer structure can have a good manufacturing process yield or quality during the manufacturing process.

To make the aforementioned more comprehensible, several embodiments accompanied by drawings are described in detail as follows.

DESCRIPTION OF THE EMBODIMENTS

Figure 1:
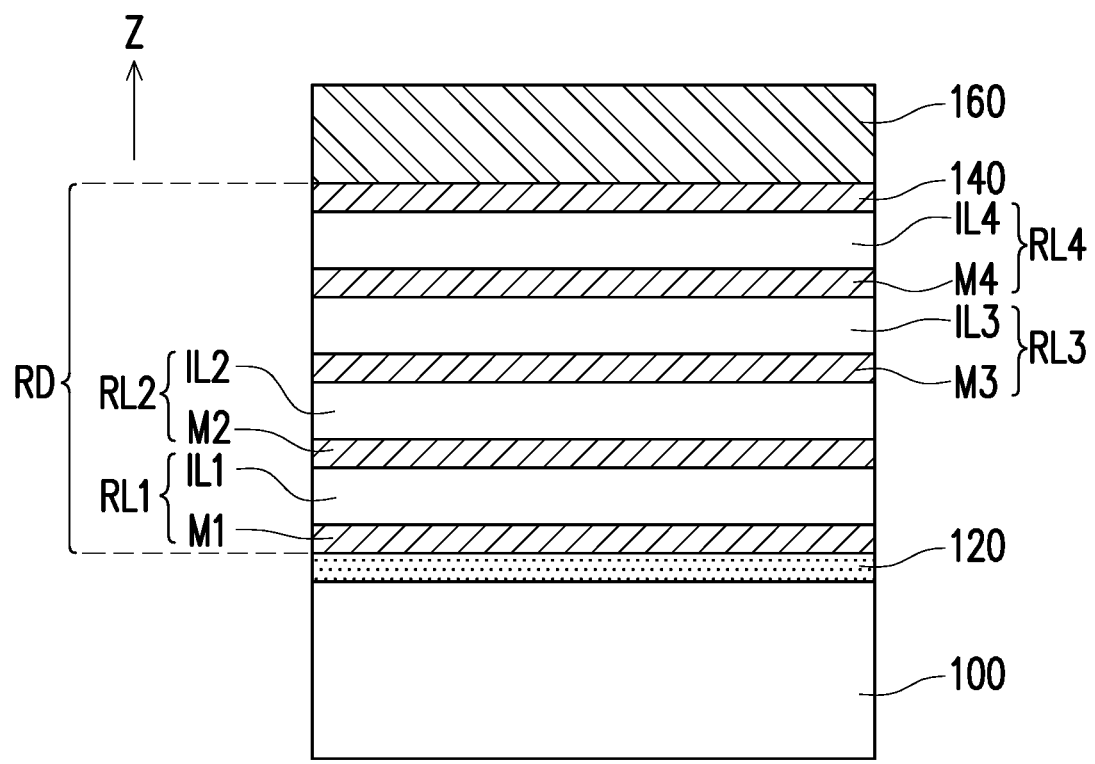
FIG. 1 is a schematic cross-sectional view of a redistribution layer structure according to an embodiment of the disclosure.

This disclosure may be understood with reference to detailed description in conjunction with accompanying drawings as follows. It should be noted that, for ease of understanding by a reader and for clarity of the drawings, only a part of the electronic component is illustrated in the multiple drawings of this disclosure, and specific elements in the drawings are not drawn according to actual scale. In addition, the number and size of each element in the drawing are only for illustrative purpose, and are not meant to limit the scope of the disclosure.

Certain words are used throughout the specification and the appended claims to refer to specific elements. Those skilled in the art should understand that electronic component manufacturers may refer to the same elements by different names. This text does not intend to distinguish those elements with the same function but different names. In the following descriptions and claims, words such as "including", "containing", and "having" are open-ended words, thus, they should be interpreted as "containing, but not limited to . . . ". Therefore, when the terms "including", "containing", and/or "having" are used in the descriptions of the disclosure, they specify the existence of corresponding features, regions, steps, operations and/or components, but do not exclude the existence of one or more corresponding features, regions, steps, operations, and/or components.

Directional terms mentioned in this text, such as "upper", "lower", "front", "back", "left", or "right", are only directions with reference to the drawings. Therefore, the directional terms used are for illustration, and are not meant to limit this disclosure. Each of the drawings shows the general features of the methods, structures, and/or materials used in a specific embodiment. However, these drawings should not be construed as defining or limiting the scope or nature covered by these embodiments. For example, for the sake of clarity, the relative size, thickness, and position of each film layer, region, and/or structure may be reduced or enlarged.

In this disclosure, the length and width may be measured by using an optical microscope, and the thickness may be obtained by measuring the cross-sectional image in an electron microscope, but the disclosure is not limited thereto.

Terms such as "approximately", "equal to", "equivalent", "same", "substantially", or "roughly" are generally interpreted as being within 20% of a given value, or interpreted as being within a range of 10%, 5%, 3%, 2%, 1%, or 0.5% of a given value.

When a structure (layer, component, or substrate) described in the disclosure is located on/above another structure (layer, component, or substrate), it may indicate that the two structures are adjacent and directly connected, or it may also indicate that the two structures are adjacent and indirectly connected. Being indirectly connected indicates that there is at least one intermediary structure (intermediary layer, intermediary component, intermediary substrate, or intermediary spacing) between the two structures, in which a bottom surface of one structure is adjacent or directly connected to a top surface of the intermediary structure, and a top surface of the other structure is adjacent or directly connected to a bottom surface of the intermediary structure, and the intermediary structure may include a single-layer or a multi-layer physical structure or non-physical structure, without any limitation. In the disclosure, when a structure is disposed "on" another structure, it may indicate that the structure is "directly" on the other structure, or that the structure is "indirectly" on the other structure. That is, at least one structure is sandwiched between the structure and the other structure.

Terms such as "first", and "second" in the specification of the disclosure may be used herein to describe various elements, components, regions, layers and/or parts, but these elements, components, regions, and/or parts should not be restricted by these terms. These terms are only used to distinguish one element, component, region, layer, or part from another element, component, region, layer, or part. Therefore, a "first element", "component", "region", "layer", or "part" discussed below is used to distinguish from a "second element", "component", "region", "layer", or "part", and are not meant to limit an order or specific elements, components, regions, layers, and/or parts. Moreover, the "first" element referred to in the descriptions of the specification may be renamed as the "second" element in the claims.

An electronic component may have a redistribution layer structure according to an embodiment of the disclosure. For example, the electronic component may be a semiconductor package type electronic component, such as a system on chip (SoC), a system in package (SiP), or other electronic components manufactured through the manufacturing method of the disclosure. The electronic component may be used in an electronic device such as a display device, an antenna device, a sensing device, a splicing device, or a transparent display device, but is not limited thereto. The electronic component may be a rollable, stretchable, bendable, or flexible electronic component. The electronic component may, for example, include liquid crystal, light-emitting diode (LED), quantum dot (QD), fluorescence, phosphor, or other suitable materials, and the materials may be arbitrarily arranged and combined, or other suitable display media, or a combination of the foregoing. The light-emitting diode may include, for example, an organic light-emitting diode (OLED), a millimeter/sub-millimeter light-emitting diode (mini LED), a micro light-emitting diode (micro LED), or a quantum dot (QD) light-emitting diode (such as a QLED, a QDLED), but is not limited thereto. The antenna device may be, for example, a liquid crystal antenna, but is not limited thereto. The splicing device may be, for example, a display splicing device or an antenna splicing device, but is not limited thereto. It should be noted that the electronic component may be any combination of the foregoing, but is not limited to this. In addition, the appearance of the electronic component may be rectangular, circular, polygonal, a shape with curved edges, or other suitable shapes. The electronic component may have a peripheral system such as a driving system, a control system, a light source system, or a shelf system to support the display device, the antenna device, or the splicing device. Hereinafter, the redistribution structure is used to describe the content of the disclosure, but the disclosure is not limited thereto.

In the disclosure, various embodiments described below may be mixed and matched without departing from the spirit and scope of the disclosure. For example, some features of an embodiment may be combined with some features of another embodiment to form another embodiment.

Reference will now be made in detail to the exemplary embodiments of the disclosure, and examples of the exemplary embodiments are illustrated in the accompanying drawings. Whenever possible, the same reference numerals are used in the drawings and the description to indicate the same or similar parts.

FIG. 1 is a schematic cross-sectional view of a redistribution layer structure according to an embodiment of the disclosure. Several elements are omitted in FIG. 1 for clarity of the drawings and convenience of description. With reference to FIG. 1, a redistribution layer structure RD disposed on a substrate 100 is, for example, a redistribution circuit for achieving a high-density integrated circuit (IC), but is not limited thereto. The redistribution layer structure RD may include multiple conductive layers and multiple dielectric layers alternately stacked in a normal direction (for example, a Z-axis direction in FIG. 1) of the substrate 100.

FIG. 1 shows a portion of the redistribution layer structure RD. The redistribution layer structure RD includes a stack of multiple redistribution layers. Each redistribution layer includes, for example, a stack of a metal layer and a dielectric layer, but is not limited thereto. In some embodiments, the redistribution layer structure RD is, for example, a stack of four redistribution layers RL1, RL2, RL3, and RL4, but is not limited thereto.

In some embodiments, the redistribution layer structure RD includes at least a first metal layer M1 and a first dielectric layer IL1. In some embodiments, the redistribution layer structure RD further includes a second metal layer M2, a second dielectric layer IL2, a third metal layer M3, a third dielectric layer IL3, a fourth metal layer M4, and a fourth dielectric layer IL4. In this embodiment, the first dielectric layer IL1 is disposed on the first metal layer M1. The second metal layer M2 is disposed on the first dielectric layer IL1. The second dielectric layer IL2 is disposed on the second metal layer M2. The third metal layer M3 is disposed on the second dielectric layer IL2. The third dielectric layer IL3 is disposed on the third metal layer M3. The fourth metal layer M4 is disposed on the third dielectric layer IL3. The fourth dielectric layer IL4 is disposed on the fourth metal layer M4. It should be noted that, in the disclosure, the metal layers M1, M2, M3, and M4 may respectively be circuit layers formed by patterning, but are not limited thereto. In order to make the drawings clearer, FIG. 1 schematically shows the four redistribution layers RL1, RL2, RL3, and RL4 including four metal layers and four dielectric layers, but the number of film layers shown in FIG. 1 a is not intended to limit the disclosure. In other embodiments, the number of the metal layers and the dielectric layers may be more or less, depending on actual requirements. In addition, the disclosure does not limit a layout of the redistribution layer structure RD. In the embodiment, there is a difference between a coefficient of thermal expansion (CTE) of the first dielectric layer IL1 and a coefficient of thermal expansion of the first metal layer of the redistribution layer structure RD. Due to different material choices of the first dielectric layer, in some embodiments of the disclosure, a range of the difference is from 0% to 70% of the coefficient of thermal expansion of the first dielectric layer IL1 (0≤coefficient of thermal expansion difference/coefficient of thermal expansion of the dielectric layer ≤70%). In other embodiments, the range of the difference is from 0% to 55% of the coefficient of thermal expansion of the first dielectric layer IL1 (0≤coefficient of thermal expansion difference/coefficient of thermal expansion of the dielectric layer≤55%). And, in other embodiments, the range of the difference is from 0% to 40% of the coefficient of thermal expansion of the first dielectric layer IL1 (0≤coefficient of thermal expansion difference/ coefficient of thermal expansion of the dielectric layer≤40%). However, the disclosure is not limited thereto. When a material of the first dielectric layer IL1 is adjusted, the coefficient of thermal expansion of the first dielectric layer IL1 may match the coefficient of thermal expansion of the first metal layer M1, thereby lowering a deformation difference due to rising and falling temperatures during the manufacturing process. In this way, a probability of warping between the first dielectric layer IL1 and the first metal layer M1 may be lowered, or a probability of peeling between the first dielectric layer IL1 and the first metal layer M1 may be reduced. A warpage issue of the redistribution layer structure RD may be improved, or the redistribution layer structure RD can have good reliability, structural strength or quality. In addition, in terms of the manufacturing process, the redistribution layer structure RD can have a good manufacturing process yield or quality. A material and a structural relationship of each film layer are briefly described as follows.

With reference to FIG. 1, the redistribution layer structure RD of the embodiment may be disposed on the substrate 100 during the manufacturing process, and the substrate 100 is removed after the manufacturing process is completed. A material of the substrate 100 includes an organic or an inorganic material, such as glass, quartz, sapphire, silicon wafer, stainless steel, or ceramics, a molding compound (such as polycarbonate (PC), polyimide (PI), polyethylene terephthalate (PET), a resin, an epoxy resin, and an organosilicon compound), other suitable substrate materials, or a combination of the foregoing, but is not limited thereto. It should be noted that a package structure may be formed by an RDL-first manufacturing method or a chip-first manufacturing method. In the RDL-first manufacturing method, the redistribution layer structure RD is formed before the chip molding process. In the chip-first manufacturing method, the chip molding process is performed before the formation of the redistribution layer. The RDL-first manufacturing method is exemplarily used in the present disclosure. In the chip-first manufacturing method, a chip molding process is performed to make a substrate 100 including at least one chip and a molding compound, and then the redistribution layer is formed on the substrate 100.

In some embodiments, a release layer 120 may be selectively disposed on the substrate 100. The release layer 120 is, for example, a photo-curable release film or a thermal curable release film, but is not limited thereto. A viscosity of the photo-curable release film is reduced through a photo-curing process. A viscosity of the thermal curable release film is reduced through a thermal-curing process. In other embodiments, the release layer 120 may also be a laser debond release film.

In the embodiment, the first redistribution layer RL1 of the redistribution layer structure RD is disposed on the substrate 100. The first redistribution layer RL1 includes the first metal layer M1 and the first dielectric layer IL1. The first metal layer M1 of the first redistribution layer RL1 is disposed on the release layer 120. A material of the first metal layer M1 may include molybdenum (Mo), tantalum (Ta), niobium (Nb), hafnium (HO), nickel (Ni), chromium (Cr), Cobalt (Co), zirconium (zirconium, Zr), tungsten (W), aluminum (Al), titanium (Ti), copper (Cu), other suitable metals, or an alloy or a combination of the above-mentioned materials. In some embodiments, the first metal layer M1 is, for example, a single-layer metal layer or a stacked-layer structure having multiple stacked sub-metal layers. For example, the first metal layer M1 may be a copper layer with a single-layer structure. Alternatively, the first metal layer M1 may include at least two stacked sub-metal layers, for example, one of the two sub-metal layers may include titanium, and the other of the two sub-metal layers may include copper. Therefore, the first metal layer M1 may be a multi-layer structure of titanium-copper, but is not limited thereto.

The first dielectric layer IL1 is disposed on the first metal layer M1. A material of the first dielectric layer IL1 may include photosensitive polyimide, photosensitive polybenzoxazole (photosensitive PBO), benzocyclobutene (BCB), polyaromatic fluorocarbons, photosensitive polyphenylene ether (photosensitive PPE), or other suitable materials, but is not limited thereto.

A thickness of the first dielectric layer IL1 may be defined as a maximum distance from a top surface to a bottom surface of the first dielectric layer IL1 in the normal direction (for example, the Z-axis direction shown in FIG. 1) of the substrate 100. The thickness of the first dielectric layer IL1 is, for example, 5 micrometers (μm) to 15 μm (5 μm≤thickness≤15 μm), but is not limited thereto. In other embodiments, the thickness of the first dielectric layer IL1 may be 9 μm to 13 μm (9 μm≤thickness≤13 μm). A Young's modulus of the first dielectric layer IL1 is 3 GPa (gigapascal) to 5 GPa (3 GPa≤Young's modulus≤5 GPa), but is not limited thereto. The coefficient of thermal expansion of the first dielectric layer IL1 may be from 20 ppm/° C. (one millionth of a temperature change per Celsius) to 40 ppm/° C. (20 ppm/° C.≤coefficient of thermal expansion≤40 ppm/° C.), but is not limited thereto. For example, the coefficient of thermal expansion of the first dielectric layer IL1 is 20 ppm/° C. In other embodiments, the coefficient of thermal expansion of the first dielectric layer IL1 is 30 ppm/° C. or 40 ppm/° C., but is not limited thereto.

In some embodiments, a thickness of the first metal layer M1 may be defined as a maximum distance from a top surface to a bottom surface of the first metal layer M1 in the normal direction of the substrate 100. The thickness of the first metal layer M1 is, for example, 4 μm to 13 μm (4 μm≤thickness≤13 μm), but is not limited thereto. A Young's modulus of the first metal layer M1 is 90 GPa to 120 GPa (90 GPa≤Young's modulus≤120 GPa), but is not limited to this. The coefficient of thermal expansion of the first metal layer M1 is 18 ppm/° C., but is not limited to this. In other embodiments, the coefficient of thermal expansion of the first metal layer M1 may be from 16 ppm/° C. to 20 ppm/° C. (16 ppm/° C.≤coefficient of thermal expansion≤20 ppm/° C.). It should be noted that when the first metal layer M1 is a stack of multiple sub-metal layers, the coefficient of thermal expansion of the first metal layer M1 is adjusted by factors such as material characteristics of each of the sub-metal layers and thickness of each of the sub-metal layers. At this time, the coefficient of thermal expansion value of the first metal layer M1 may be obtained through calculation or actual measurement.

It should be noted that in the redistribution layer structure RD according to an embodiment of the disclosure, the coefficient of thermal expansion of the first dielectric layer IL1 may match the coefficient of thermal expansion of the first metal layer M1. The above-mentioned matching is defined as a range of the difference between the coefficient of thermal expansion of the first dielectric layer IL1 and the coefficient of thermal expansion of the first metal layer M1 is 0% to 70% of the coefficient of thermal expansion of the first dielectric layer IL1. The formula is as follows:

$$\frac{CTE \text{ of the first dielectric layer} - CTE \text{ of the first metal layer}}{CTE \text{ of the first dielectric layer}} \times 100\% = \text{Percentage difference}$$

Taking the coefficient of thermal expansion of the first metal layer M1 to be 18 ppm/° C. as an example, when the coefficient of thermal expansion of the first dielectric layer IL1 is 20 ppm/° C., a percentage difference between the first dielectric layer IL1 and the second metal layer M1 is:

$$\frac{20-18}{20} \times 100\% = 10\%$$

That is to say, in the embodiment, the percentage difference between the coefficients of thermal expansion of the first dielectric layer IL1 and the first metal layer M1 is 10% of the coefficient of thermal expansion of the first dielectric layer IL1, and is less than 70% of the coefficient of thermal expansion of the first dielectric layer IL1. Therefore, the coefficient of thermal expansion of the first dielectric layer IL1 matches the coefficient of thermal expansion of the first metal layer M1. In the above-mentioned disposition, a deformation difference between the first dielectric layer IL1 and the first metal layer M1 due to rising and falling temperatures during the manufacturing process may be reduced. In this way, the probability of warping between the first dielectric layer IL1 and the first metal layer M1 may be lowered, or the probability of peeling between the first dielectric layer IL1 and the first metal layer M1 may be reduced. The warpage issue of the redistribution layer structure RD may be improved. The redistribution layer structure RD can have good reliability, structural strength or quality. In addition, in terms of the manufacturing process, the redistribution layer structure RD can have a good manufacturing process yield or quality.

In addition to the first redistribution layer RL1, the redistribution layer structure RD may also sequentially include a stacked layer of the second redistribution layer RL2, the third redistribution layer RL3, and the fourth redistribution layer RL4, but the disclosure is not limited to the number of redistribution layers shown above.

The second redistribution layer RL2 is disposed on the first redistribution layer RL1. The second redistribution layer RL2 includes the second metal layer M2 and the second dielectric layer IL2. For example, the second metal layer M2 is disposed on the first dielectric layer IL1.

A material of the second metal layer M2 may be the same as or different from the material of the first metal layer M1, for example, including molybdenum, tantalum, niobium, hafnium, nickel, chromium, cobalt, zirconium, tungsten, aluminum, titanium, copper, other suitable metals, or an alloy or a combination of the above-mentioned materials. Similar to the first metal layer M1, in some embodiments, the second metal layer M2 is, for example, a single-layer metal layer or a stacked-layer structure having multiple stacked sub-metal layers. For example, the second metal layer M2 may be a copper layer with a single-layer structure. Alternatively, the second metal layer M2 may include at least two stacked sub-metal layers, in which one of the two sub-metal layers includes titanium, and the other of the two sub-metal layers includes copper. Therefore, the second metal layer M2 may be a multi-layer structure of titanium-copper, but is not limited thereto.

In some embodiments, the first metal layer M1 and the second metal layer M2 are separated by the first dielectric layer IL1, but the disclosure is not limited thereto. In other embodiments, multiple conductive via holes (not shown) may be disposed between the first metal layer M1 and the second metal layer M2. The first metal layer M1 and the second metal layer M2 may be electrically connected to each other through at least some of the conductive vias. In other words, the first metal layer M1 and the second metal layer M2 may be interconnected circuits in the redistribution layer structure RD.

The second dielectric layer IL2 is disposed on the second metal layer M2. Similar to the first dielectric layer IL2, a material of the second dielectric layer IL2 may include photosensitive polyimide, photosensitive polybenzoxazole, benzocyclobutene, polyaromatic fluorocarbon, photosensitive polyphenylene ether, or other suitable materials, but is not limited thereto.

A thickness of the second dielectric layer IL2 may be defined as a maximum distance from a top surface to a bottom surface of the second dielectric layer IL2 in the normal direction (the Z axis in FIG. 1) of the substrate 100. The thickness of the second dielectric layer IL2 is, for example, 5 μm to 15 μm (5 μm≤thickness≤15 μm), but is not limited thereto. In other embodiments, the thickness of the second dielectric layer IL2 may be 9 μm to 13 μm (9 μm≤thickness≤13 μm). In some embodiments, the thickness of the first dielectric layer IL1 and the second dielectric layer IL2 may be the same or different. In the embodiment, the thickness of the first dielectric layer IL1 and the second dielectric layer IL2 may, for example, be substantially the same.

A Young's modulus of the second dielectric layer IL2 is 3 GPa to 5 GPa (3 GPa≤Young's modulus≤5 GPa), but is not limited thereto. A coefficient of thermal expansion of the second dielectric layer IL2 may be 20 ppm/° C. to 40 ppm/° C. (20 ppm/° C.≤coefficient of thermal expansion≤40 ppm/° C.), but is not limited to this. For example, the coefficient of thermal expansion of the second dielectric layer IL2 is 20 ppm/° C. In other embodiments, the coefficient of thermal expansion of the second dielectric layer IL2 is 30 ppm/° C. or 40 ppm/° C., but is not limited thereto.

In some embodiments, a thickness of the second metal layer M2 may be defined as a maximum distance from a top surface to a bottom surface of the second metal layer M2 in the normal direction (the Z axis in FIG. 1) of the substrate 100. The thickness of the second metal layer M2 is, for example, 4 μm to 13 μm (4 μm≤thickness≤13 μm), but is not limited thereto. A Young's modulus of the second metal layer M2 is 90 GPa to 120 GPa (90 GPa≤Young's modulus ≤120 GPa), but is not limited thereto. A coefficient of thermal expansion of the second metal layer M2 is 18 ppm/° C., but is not limited thereto. In other embodiments, the coefficient of thermal expansion of the second metal layer M2 may be 16 ppm/° C. to 20 ppm/° C. (16 ppm/° C.≤coefficient of thermal expansion≤20 ppm/° C.).

It should be noted that similar to the first dielectric layer, in the redistribution layer structure RD, the coefficient of thermal expansion of the second dielectric layer IL2 may match the coefficient of thermal expansion of the second metal layer M2. For example, in some embodiments, a range of a difference between the coefficient of thermal expansion of the second dielectric layer IL2 and the coefficient of thermal expansion of the second metal layer M2 is 0% to 70% of the coefficient of thermal expansion of the second dielectric layer IL2 (0≤coefficient of thermal expansion difference/coefficient of thermal expansion of the dielectric layer≤70%). In other embodiments, the difference is in a range of 0% to 55% of the coefficient of thermal expansion of the second dielectric layer IL2 (0≤coefficient of thermal expansion difference/coefficient of thermal expansion of the dielectric layer≤55%). In other embodiments, the difference is in a range of 0% to 40% of the coefficient of thermal expansion of the second dielectric layer IL2 (0≤coefficient of thermal expansion difference/coefficient of thermal expansion of dielectric layer≤40%). However, the disclosure is not limited thereto. In the above-mentioned disposition, a deformation difference between the second dielectric layer IL2 and the second metal layer M2 due to rising and falling temperatures during the manufacturing process may be reduced. In this way, a probability of warping between the second dielectric layer IL2 and the second metal layer M2 may be lowered, or a probability of peeling between the second dielectric layer IL2 and the second metal layer M2 may be reduced. In addition, a probability of warping or a probability of peeling between the redistribution layer RL1 and the redistribution layer RL2 may be lowered. The warpage issue of the redistribution layer structure RD may be improved. The redistribution layer structure RD can have good reliability, structural strength or quality. In addition, in terms of the manufacturing process, the redistribution layer structure RD can have a good manufacturing process yield or quality.

In some embodiments, the third redistribution layer RL3 may be disposed on the second redistribution layer RL2, and a fourth redistribution layer RL4 may also be disposed on the third redistribution layer RL3. The third redistribution layer RL3 includes the third metal layer M3 and the third dielectric layer IL3, and the fourth redistribution layer RL4 includes the fourth metal layer M4 and the fourth dielectric layer IL4. For example, the third metal layer M3 is disposed on the second dielectric layer IL2, and the fourth metal layer M4 is disposed on the third dielectric layer IL3. Materials and structures of the third metal layer M3 and the fourth metal layer M4 may be similar to those of the first metal layer M1 or the second metal layer M2, therefore they are not repeated here. The second metal layer M2 and the third metal layer M3 are separated by the second dielectric layer IL2, and the third metal layer M3 and the fourth metal layer M4 are separated by the third dielectric layer IL3, but the disclosure is not limited thereto. In other embodiments, multiple conductive vias (not shown) may be respectively disposed between the second metal layer M2 and the third metal layer M3, and between the third metal layer M3 and the fourth metal layer M4, which enables the second metal layer M2 and the third metal layer M3, and the third metal layer M3 and the fourth metal layer M4 to be respectively electrically connected to each other through at least some of the conductive vias.

Materials and structures of the third dielectric layer IL3 and the fourth dielectric layer IL4 are similar to those of the first dielectric layer IL1 or the second dielectric layer IL2, therefore they are not repeated here. A thickness of the third dielectric layer IL3 may be defined as a maximum distance from a top surface to a bottom surface of the third dielectric layer IL3 in the normal direction (the Z axis in FIG. 1) of the substrate 100. The thickness of the third dielectric layer IL3 is, for example, 5 μm to 15 μm (5 μm≤thickness≤15 μm), but is not limited thereto. In other embodiments, the thickness of the third dielectric layer IL3 may be 5 μm to 9 μm (5 μm≤thickness≤9 μm). In some embodiments, the thickness of the first dielectric layer IL1 and the third dielectric layer IL3 may be the same or different. In the embodiment, the thickness of the first dielectric layer IL1 and the third dielectric layer IL3 may be, for example, substantially the same. A thickness range and a measurement manner of the fourth dielectric layer IL4 may be similar to those of the third dielectric layer IL3, which would not be repeated here.

Ranges of Young's modulus of the third dielectric layer IL3 and the fourth dielectric layer IL4 may be 1 GPa to 3 GPa (1 GPa≤Young's modulus≤3 GPa), but are not limited thereto. Ranges of coefficients of thermal expansion of the third dielectric layer IL3 and the fourth dielectric layer IL4 may be similar to those of the first dielectric layer IL1, which would not be repeated here.

In some embodiments, a thickness of the third metal layer M3 may be defined as a maximum distance from a top surface to a bottom surface of the third metal layer M3 in the normal direction (the Z axis in FIG. 1) of the substrate 100. The thickness of the third metal layer M3 is, for example, 4 μm to 13 μm (4 μm≤thickness≤13 μm), but is not limited thereto. A Young's modulus of the third metal layer M3 is 90 GPa to 120 GPa (90 GPa≤Young's modulus≤120 GPa), but is not limited thereto. A coefficient of thermal expansion of the third metal layer M3 is 18 ppm/° C., but is not limited thereto. In other embodiments, the coefficient of thermal expansion of the third metal layer M3 may be 16 ppm/° C. to 20 ppm/° C. A thickness range, a measurement manner, a Young's modulus, and a coefficient of thermal expansion of the fourth metal layer M4 may be similar to those of the third metal layer M3, which would not be repeated here. To put it simply, the fourth metal layer M4 is disposed on the third dielectric layer IL3, and the fourth dielectric layer IL4 is disposed on the fourth metal layer M4.

It should be noted that in the redistribution layer structure RD, the coefficients of thermal expansion of the dielectric layers IL1, IL2, IL3, and IL4 may respectively match with the coefficients of thermal expansion of the corresponding metal layers M1, M2, M3, and M4. For example, a range of a difference between the coefficients of thermal expansions of the dielectric layers IL1, IL2, IL3, and IL4 and the coefficients of thermal expansions of the corresponding metal layers M1, M2, M3, and M4 are respectively 0% to 70% of the coefficients of thermal expansion of the dielectric layers IL1, IL2, IL3, and IL4. In the above-mentioned disposition, deformation differences between the dielectric layers IL1, IL2, IL3, and IL4, and the metal layers M1, M2, M3, and M4 due to rising and falling temperatures during the manufacturing process may be reduced. In this way, probabilities of warping between the dielectric layers IL1, IL2, IL3, and IL4 and the corresponding metal layers M1, M2, M3, and M4 may be lowered, or probabilities of peeling between the dielectric layers IL1, IL2, IL3, and IL4 and the corresponding metal layers M1, M2, M3, and M4 may be reduced. In addition, a probability of warping or a probability of peeling between the redistribution layers RL1, RL2, RL3, and RL4 may be lowered. The overall warpage issue of the redistribution layer structure RD may be improved. The redistribution layer structure RD can have good reliability, structural strength or quality. In addition, in terms of the manufacturing process, the redistribution layer structure RD can have a good manufacturing process yield or quality.

In addition, the Young's modulus of the third dielectric layer IL3 or the Young's modulus of the fourth dielectric layer IL4 may be less than the Young's modulus of the first dielectric layer IL1 or the Young's modulus of the second dielectric layer IL2. In this way, rigidity of the first dielectric layer IL1 or the second dielectric layer IL2 in the bottom layer near the substrate 100 may be increased, so as to reduce deformation of the third dielectric layer IL3 or the fourth dielectric layer IL4 in the top layer. The overall warpage issue of the redistribution layer structure RD may be improved. The redistribution layer structure RD can have good reliability, structural strength or quality. In addition, in terms of the manufacturing process, the redistribution layer structure RD can have a good manufacturing process yield or quality.

The redistribution layer structure RD further includes a top connector 140, which is disposed on an uppermost dielectric layer (for example, the fourth dielectric layer IL4 in the embodiment) of the redistribution layer structure RD and electrically connected to a metal layer (for example, the fourth metal layer M4 in the embodiment) corresponding to the uppermost dielectric layer. The top connector 140 may be, for example, an uppermost pad of the redistribution layer structure RD, but is not limited thereto. The top connector 140 is, for example, a single-layer metal layer or a stacked-layer structure having multiple stacked sub-metal layers. For example, the top connector 140 may be a copper layer with a single-layer structure. Alternatively, the top connector 140 may include a stack of sub-metal layers. For example, the top connector 140 may be a multi-layer metal structure of titanium-copper, but is not limited thereto.

In some embodiments, an electronic component 160 (e.g., a chip) and a package material layer (not shown in the figure) may also be disposed above the redistribution layer structure RD to form a package structure. The electronic component 160 is disposed on the fourth dielectric layer IL4 and/or the top connector 140. The electronic component 160 is, for example, a chip, a die, a diode, a transistor, an integrated circuit (IC), or a combination of the above-mentioned elements, or other suitable electronic elements, but is not limited thereto. The electronic component 160 may be electrically connected to the fourth metal layer M4 through the top connector 140, but is not limited thereto. In some embodiments, since the metal layers are electrically connected to each other, the electronic component 160 may be electrically connected to the first metal layer M1 through the top connector 140.

In some embodiments, the package material layer is disposed on the fourth dielectric layer IL4 or the top connector 140. The package material layer may encapsulate the electronic component 160 to embed the electronic component 160 into the package material layer. A material of the package material layer is, for example, epoxy, or other suitable materials, and is not limited thereto.

In other embodiments, taking the redistribution layer structure RD which includes the two-layer redistribution layer of the first redistribution layer RL1 and the second redistribution layer RL2 as an example, the top connector 140 may be disposed on the dielectric layer IL2 of the second redistribution layer RL2. The top connector 140 may be electrically connected to the second metal layer M2, so as to be electrically connected to the first metal layer M1 of the first redistribution layer RL1, but is not limited thereto.

In short, in the redistribution layer structure RD, as the coefficients of thermal expansion of the dielectric layers IL1, IL2, IL3, and IL4 may match the coefficients of thermal expansion of the corresponding metal layers M1, M2, M3, and M4, the overall warpage issue of the redistribution layer structure RD may be improved. The redistribution layer structure RD can have good reliability, structural strength or quality. In addition, in terms of the manufacturing process, the redistribution layer structure RD can have a good manufacturing process yield or quality.

In addition, the Young's modulus of the dielectric layers IL1, IL2, IL3, and IL4 may be controlled. In this way, the Young's modulus or the rigidity of the first dielectric layer IL1 or the second dielectric layer IL2 in the bottom layer near the substrate 100 may be increased, so as to reduce the deformation of the third dielectric layer IL3 or the fourth dielectric layer IL4 in the top layer. The overall warpage issue of the redistribution layer structure RD may be improved. The redistribution layer structure RD can have good reliability, structural strength or quality. In addition, in terms of the manufacturing process, the redistribution layer structure RD can have a good manufacturing process yield or quality.

Other embodiments are listed below as an illustration of the manufacturing process. It must be noted here that the following embodiments continue to use the reference numerals and a portion of the content of the foregoing embodiments. The same reference numerals are used to represent the same or similar elements, and the description of the same technical content is omitted. Reference may be made to the foregoing embodiments for the description of the omitted parts, which are not repeated in the following embodiments.

Figure 2:
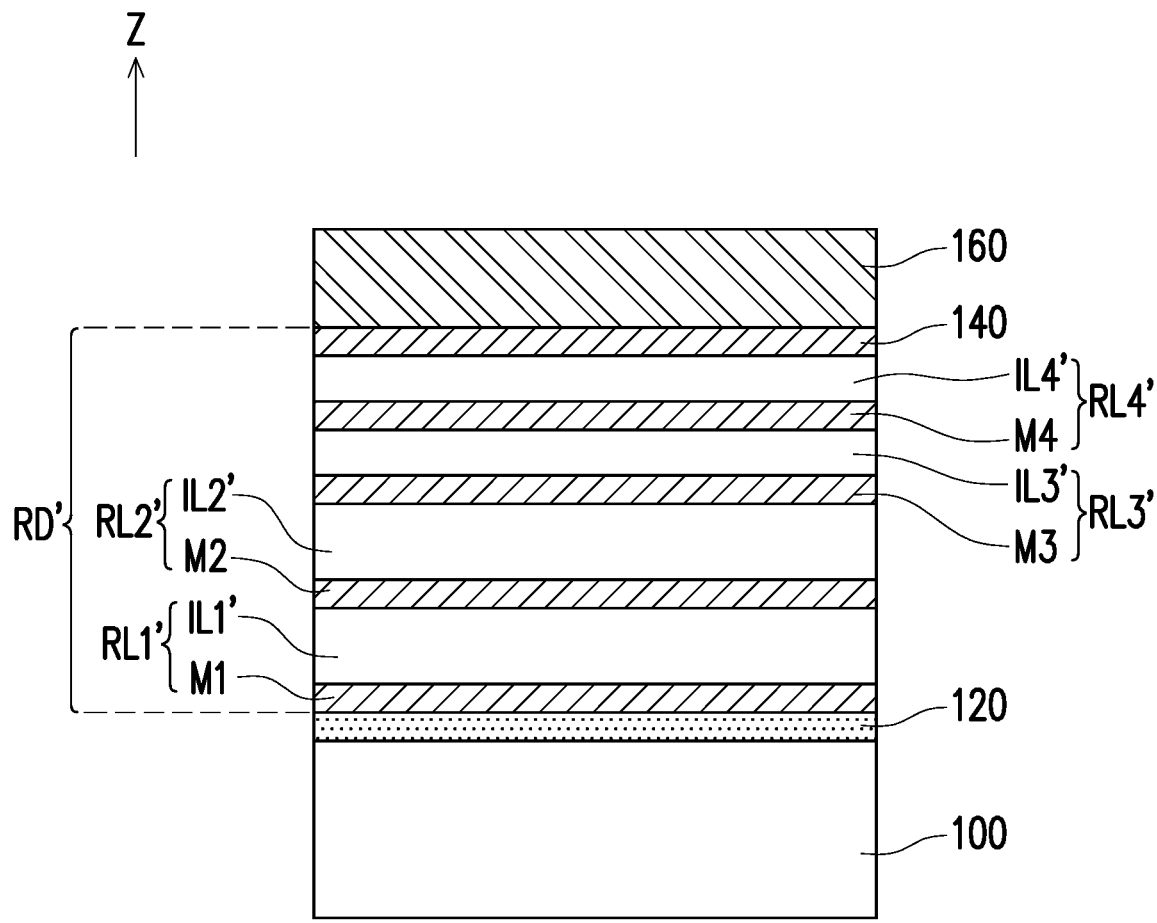
FIG. 2 is a schematic cross-sectional view of a redistribution layer structure according to another embodiment of the disclosure.

FIG. 2 is a schematic cross-sectional view of a redistribution layer structure according to another embodiment of the disclosure. A redistribution layer structure RD' of this embodiment is roughly similar to the redistribution layer structure RD in FIG. 1. A main difference between the embodiments shown in FIGS. 2 and 1 is a difference in the thicknesses of the dielectric layers (for example, the thickness of the first dielectric layer is greater than the thickness of the third dielectric layer), therefore the same and similar components in the two embodiments are not repeated here. A manufacturing manner of the redistribution layer structure RD' of the disclosure is described below with reference to FIG. 2.

Firstly, the substrate 100 is provided. In the embodiment, the substrate 100 is, for example, a glass substrate, but is not limited thereto. In some embodiment, the substrate 100 is a wafer or a substrate which includes at least one chip and a molding compound. A thickness of the substrate 100 is, for example, 500 μm to 1500 μm, but is not limited thereto.

Then, before disposing the first metal layer M1 of the first redistribution layer RL1' on the substrate 100, the release layer 120 may be selectively disposed on the substrate 100. A thickness of the release layer 120 is 0.5 μm to 1.5 μm, but is not limited thereto. A material of the release layer 120 includes a photo-curable release film or a thermal curable release film, but is not limited thereto. For example, the material of the release layer 120 may include polyethylene (PE), polyethylene terephthalate (PET), oriented polypropylene (OPP), or other suitable materials, or a combination of the above-mentioned materials, but is not limited thereto. The release layer 120 may be decomposed through an illumination system or a heating system. For example, in the case of a photodissociation system, the release layer 120 may be irradiated by a laser beam or an ultraviolet beam, so that the release layer 120 absorbs energy of the beam to generate a dissociation reaction. In this way, the release layer 120 may be easily separated from the first metal layer M1. For a thermal dissociation system, the release layer 120 may be heated by a heat source, so that the release layer 120 absorbs energy of the heat source to generate a dissociation reaction. In this way, the release layer 120 may be easily separated from the first metal layer M1. Other dissociation systems may also be used, and are not limited by the disclosure. It should be noted that in some embodiments, the removal of the release layer 120 and the substrate 100 is not necessary. That is, according to some embodiments, the release layer 120 and the substrate 100 are remained as a part of the package structure. In some other embodiments, the release layer 120 and the substrate 100 are removed and are not included in the package structure.

Next, a first redistribution layer RL1' is disposed on the substrate 100. The first redistribution layer RL1' includes the first metal layer M1 and a first dielectric layer IL1'. The step of disposing the first redistribution layer RL1' includes forming the first metal layer M1 on the release layer 120 that is on the substrate 100. In the embodiment, the first metal layer M1 may be a single-layer metal layer or a stacked-layer structure having multiple stacked sub-metal layers. For example, the first metal layer M1 may include a stack of three sub-metal layers. In detail, a layer of titanium metal layer with a thickness of 0.1 μm to 0.3 μm may be disposed on the release layer 120 first. Next, a thin copper metal layer with a thickness of 0.2 μm to 0.5 μm is disposed on the titanium metal layer. Then, a thick copper metal layer with a thickness of 4 μm to 12 μm is disposed on the copper metal layer. The method of forming the first metal layer M1 may include processes such as sputtering, evaporation, physical vapor deposition (PVD), chemical vapor deposition (CVD), or electroplating, but is not limited thereto. In the above-mentioned disposition, the first metal layer M1 may be, for example, a stacked structure of titanium-copper-copper.

Next, the first dielectric layer IL1' is disposed on the first metal layer M1. A material of the first dielectric layer IL1' include photosensitive polyimide, photosensitive polybenzoxazole (photosensitive PBO), benzocyclobutene (BCB), polyaromatic flurocarbons, photosensitive polyphenylene ether (photosensitive PPE), or other suitable materials, but is not limited thereto. A method of forming method of the first dielectric layer IL1' includes chemical vapor deposition, physical vapor deposition, atomic layer deposition (ALD), spin coating, screen printing, or other suitable methods. In some embodiments, a thickness of the first dielectric layer IL1' is, for example, 9 μm to 13 μm, but is not limited thereto. In some embodiments, the thickness of the first dielectric layer IL1' may be 5 μm to 15 μm.

It should be noted that in the redistribution layer structure RD', a coefficient of thermal expansion of the first dielectric layer IL1' may match the coefficient of thermal expansion of the first metal layer M1. For example, a range of a difference between the coefficient of thermal expansion of the first dielectric layer IL1' and the coefficient of thermal expansion of the first metal layer M1 is 0% to 70% of the coefficient of thermal expansion of the first dielectric layer IL1'. In some embodiments, the difference between the two may fall within a range of 0% to 55% or 0% to 40% of the coefficient of thermal expansion of the first dielectric layer IL1'. In other words, the coefficient of thermal expansion of the first dielectric layer IL1' and the coefficient of thermal expansion of the first metal layer M1 may be close to each other and may be matching. In the above-mentioned disposition, a deformation difference between the first dielectric layer IL1' and the first metal layer M1 due to rising and falling temperatures during the manufacturing process may be reduced. In this way, a probability of warping between the first dielectric layer IL1' and the first metal layer M1 may be lowered, or a probability of peeling between the first dielectric layer IL1' and the first metal layer M1 may be reduced. A warpage issue of the redistribution layer structure RD' may be improved. The redistribution layer structure RD' can have good reliability, structural strength or quality. In addition, in terms of the manufacturing process, the redistribution layer structure RD' can have a good manufacturing process yield or quality.

Then, a second redistribution layer RL2' is disposed on the first redistribution layer RL1'. Before the step of disposing the second redistribution layer RL2', multiple conductive vias may be selectively disposed in the first dielectric layer IL1'. The second redistribution layer RL2' includes the second metal layer M2 and a second dielectric layer IL2'. The step of disposing the second redistribution layer RL2' includes forming the second metal layer M2 on the first dielectric layer IL1'. The second metal layer M2 may be electrically connected to the first metal layer M1 through the conductive vias of the first dielectric layer IL1', but is not limited thereto. In the embodiment, the second metal layer M2 may be a single-layer metal layer or a stacked-layer structure having multiple stacked sub-metal layers. For example, the second metal layer M2 may be, for example, a stacked structure of a three sub-metal layers of titanium-copper-copper, and its formation manner may be similar to that of the first metal layer M1, which is not repeated here.

Next, the second dielectric layer IL2' is disposed on the second metal layer M2. A material and a manufacturing manner of the second dielectric layer IL2' may be similar to those of the first dielectric layer IL1', which is not repeated here. The thickness of the first dielectric layer IL1' and a thickness of the second dielectric layer IL2' of the redistribution layer structure RD' may be substantially the same (for example, 9 μm to 13 μm), but are not limited thereto. In some embodiments, a Young's modulus of the first dielectric layer IL1' and a Young's modulus of the second dielectric layer IL2' may be the same, for example, 3 GPa to 5 GPa. In other embodiments, the Young's modulus of the first dielectric layer IL1' and the Young's modulus of the second dielectric layer IL2' may be different.

Next, a third redistribution layer RL3' is disposed on the second redistribution layer RL2'. Before the step of disposing the third redistribution layer RL3', multiple conductive vias may be selectively disposed in the second dielectric layer IL2'.

The third redistribution layer RL3' includes the third metal layer M3 and a third dielectric layer IL3'. The step of disposing the third redistribution layer RL3' includes forming the third metal layer M3 on the second dielectric layer IL2'. The third metal layer M3 may be electrically connected to the second metal layer M2 through the conductive vias of the second dielectric layer IL2', but is not limited thereto. In the embodiment, the third metal layer M3 may be a single-layer metal layer or a stacked-layer structure having multiple stacked sub-metal layers, and its formation manner may be similar to that of the first metal layer M1, which is not repeated here.

Next, the third dielectric layer IL3' is disposed on the third metal layer M3. A material of the third dielectric layer IL3' is similar to the material of the second dielectric layer IL2 and a method of forming the third dielectric layer IL3 is similar to the method of forming the second dielectric layer IL2', which are not repeated here. In some embodiments, a thickness of the third dielectric layer IL3' is, for example, 5 μm to 9 μm, but is not limited thereto.

Next, a fourth redistribution layer RL4' is disposed on the third redistribution layer RL3'. Before the step of disposing the fourth redistribution layer RL4', multiple conductive vias may be selectively disposed in the third dielectric layer IL3'.

The fourth redistribution layer RL4' includes a fourth metal layer M4 and a fourth dielectric layer IL4'. The step of disposing the fourth redistribution layer RL4' includes forming the fourth metal layer M4 on the third dielectric layer IL3'. The fourth metal layer M4 may be electrically connected to the third metal layer M3 through the conductive vias of the third dielectric layer IL3', but is not limited thereto. In the embodiment, the fourth metal layer M4 may be a single-layer metal layer or a stacked-layer structure having multiple stacked sub-metal layers. For example, the fourth metal layer M4 may include a stack of three sub-metal layers, and its formation manner may be similar to that of the first metal layer M1, which is not repeated here.

Next, the fourth dielectric layer IL4' is disposed on the fourth metal layer M4. A material of the fourth dielectric layer IL4' is similar to the material of the third dielectric layer IL3 and a method of forming the fourth dielectric layer IL4 is similar to the method of forming the third dielectric layer IL3', which are not repeated here. In some embodiments, a thickness of the fourth dielectric layer IL4' is, for example, 5 μm to 9 μm, but is not limited thereto. As shown in FIG. 2, the thickness of the third dielectric layer IL3' of the redistribution layer structure RD' and the thickness of the fourth dielectric layer IL4' may be substantially the same, but is not limited thereto. In some embodiments, a Young's modulus of the third dielectric layer IL3' and a Young's modulus of the fourth dielectric layer IL4' may be the same, for example, 1 GPa to 3 GPa. In other embodiments, the Young's modulus of the third dielectric layer IL3' and the Young's modulus of the fourth dielectric layer IL4' may be different.

In the above-mentioned disposition, the thickness of the first dielectric layer IL1' is substantially equal to the thickness of the second dielectric layer IL2', and the thickness of the third dielectric layer IL3' is substantially equal to the thickness of the fourth dielectric layer IL4'. In addition, the thickness of the first dielectric layer IL1' is greater than the thickness of the third dielectric layer IL3'. That is, the thickness of the first dielectric layer IL1' or the second dielectric layer IL2' may be greater than the thickness of the third dielectric layer IL3' or the fourth dielectric layer IL4'. In this way, the thickness of the dielectric layer in the bottom layer of the redistribution layer structure RD' may be thicker, and the thickness of the dielectric layer in the top layer is thinner. In other embodiments, the Young's modulus of the dielectric layer in the bottom layer of the redistribution layer structure RD' is higher, and the Young's modulus of the dielectric layer in the top layer is lower. In this way, rigidity of the first dielectric layer IL1' or the second dielectric layer IL2' in the bottom layer near the substrate 100 may be increased, so as to reduce deformation of the third dielectric layer IL3' or the fourth dielectric layer IL4' in the top layer. The overall warpage issue of the redistribution layer structure RD' may be improved. The redistribution layer structure RD' can have good reliability, structural strength or quality. In addition, in terms of the manufacturing process, the redistribution layer structure RD' can have a good manufacturing process yield or quality.

In addition, as the coefficients of thermal expansion of the dielectric layers IL1', IL2', IL3', and IL4' may match the coefficients of thermal expansion of the corresponding metal layers M1, M2, M3, and M4, deformation differences between the dielectric layers IL1', IL2', IL3', and IL4', and the metal layers M1, M2, M3, and M4 due to rising and falling temperatures during the manufacturing process may be reduced. Probabilities of warping or peeling between the redistribution layers RL1', RL2', RL3', and RL4' may be lowered. The overall warpage issue of the redistribution layer structure RD' may be improved, or the redistribution layer structure RD' can have good reliability, structural strength, or quality.

In other embodiments, thicknesses of the multi-layer dielectric layers IL1', IL2', IL3', and IL4' in the redistribution layer structure RD' may gradually decrease in a gradient from the bottom to the top. In this way, the deformation differences between the different dielectric layers IL1', IL2', IL3', and IL4' may be reduced, and influence of residual stress may be lowered. In addition, the redistribution layer structure RD' can have a good manufacturing process yield or quality during the manufacturing process.

Then, before the step of removing the substrate 100, the top connector 140 may be disposed on the fourth dielectric layer IL4'. In some embodiments, the fourth dielectric layer IL4' may include an opening (not shown). The top connector 140 may be electrically connected to the fourth metal layer M4 through the opening. The top connector 140 is, for example, a single-layer metal layer or a stacked-layer structure having multiple stacked sub-metal layers. For example, the top connector 140 may be a copper layer with a single-layer structure, or a multi-layer metal structure of titanium-copper, but is not limited thereto.

Then, the electronic component 160 is disposed on the fourth dielectric layer IL4' or the top connector 140. The electronic component 160 may be electrically connected to the fourth metal layer M4 through connecting to the top connector 140, but is not limited thereto.

Then, a package material layer (not shown) is disposed on the fourth dielectric layer IL4' or on the top connector 140. The package material layer may encapsulate the electronic component 160 to embed the electronic component 160 into the package material layer. The material of the package material layer is, for example, epoxy, or other suitable materials, and is not limited thereto.

Next, the substrate 100 is removed. Specifically, the release layer 120 may absorb energy to generate a dissociation reaction through an illumination system or a heating system, etc., so that the substrate 100 and the redistribution layer structure RD' may be separated. In some embodiments, the step of disposing the top connector 140, the step of disposing the electronic component 160, or the step of disposing the package material layer may also be performed after the step of removing the substrate 100, which is not limited by the embodiments of the disclosure.

As mentioned above, the RDL-first manufacturing method is exemplarily used in the present disclosure. The method of manufacturing the redistribution layer structures RD or RD' of the disclosure may be also applied to a chip-first manufacturing method. In the chip-first manufacturing method, a chip molding process is performed to make a substrate 100 including at least one chip and a molding compound, and then the redistribution layer is formed on the substrate 100.

The chip-first manufacturing method may be further divided into a chip-first/face-up manufacturing method and a chip-first/face-down manufacturing method. The main difference between the chip-first/face-up manufacturing method and the chip-first/face-down manufacturing method is the original locations of the pins of a chip (not shown) when the chip molding process is finished. The pins are used to electrically connect the redistribution layer structures RD or RD'.

In summary, in the redistribution layer structure according to an embodiment of the disclosure, the coefficient of thermal expansion of the dielectric layer and the coefficient of thermal expansion of the metal layer may be close to each other and may be matching. The deformation difference between the dielectric layer and the metal layer due to the rising and falling temperature during the manufacturing process may be reduced. In this way, the probability of warping between the dielectric layer and the corresponding metal layer may be lowered, or the probability of peeling between the dielectric layer and the corresponding metal layer may be reduced. In addition, the Young's modulus or the thickness of the dielectric layer may be controlled. In this way, the Young's modulus or the thickness of the dielectric layer in the bottom layer may be increased, so as to reduce the deformation of the dielectric layer in the top layer. The probabilities of warping or peeling between the redistribution layers may be lowered. The overall warpage issue of the redistribution layer structure may be improved. The redistribution layer structure can have good reliability, structural strength or quality. The redistribution layer structure can have a good manufacturing process yield or quality during the manufacturing process.

Finally, it should be noted that the foregoing embodiments are only used to illustrate the technical solutions of the disclosure, and not intended to limit the disclosure. Although the disclosure has been described in detail with reference to the foregoing embodiments, persons skilled in the art should understand that modifications to the technical solutions described in the foregoing embodiments or equivalent replacements may be made to some or all of the technical features. However, the modifications or replacements do not cause the essence of the corresponding technical solutions to depart from the scope of the technical solutions according to the embodiments of the disclosure.

What is claimed is:

1. A redistribution layer structure, comprising:
   a first metal layer;
   a first dielectric layer, disposed on the first metal layer;
   a second metal layer, disposed on the first dielectric layer;
   a second dielectric layer, disposed on the second metal layer;
   a third metal layer, disposed on the second dielectric layer;
   a third dielectric layer, disposed on the third metal layer;
   a fourth metal layer, disposed on the third dielectric layer; and
   a fourth dielectric layer, disposed on the fourth metal layer,
   wherein a range of a difference between a coefficient of thermal expansion of the first dielectric layer and a coefficient of thermal expansion of the first metal layer is 0% to 70% of the coefficient of thermal expansion of the first dielectric layer,
   wherein a Young's modulus of the third dielectric layer is less than a Young's modulus of the first dielectric layer.

2. The redistribution layer structure according to claim 1, wherein a thickness of the first dielectric layer is 5 μm to 15 μm.

3. The redistribution layer structure according to claim 1, wherein the Young's modulus of the first dielectric layer is 3 GPa to 5 GPa.

4. The redistribution layer structure according to claim 1, wherein the coefficient of thermal expansion of the first dielectric layer is 20 ppm/° C. to 40 ppm/° C.

5. The redistribution layer structure according to claim 1, wherein a thickness of the first metal layer is 4 μm to 13 μm.

6. The redistribution layer structure according to claim 1, wherein a Young's modulus of the first metal layer is 90 GPa to 120 GPa.

7. The redistribution layer structure according to claim 1, wherein the coefficient of thermal expansion of the first metal layer is 16 ppm/° C. to 20 ppm/° C.

8. The redistribution layer structure according to claim 1, wherein a thickness of the first dielectric layer is greater than a thickness of the third dielectric layer.

9. The redistribution layer structure according to claim 1, further comprising:
   a top connector, disposed on the fourth dielectric layer, wherein the top connector is electrically connected to the fourth metal layer;
   an electronic component, disposed on the fourth dielectric layer, wherein the electronic component is electrically connected to the fourth metal layer through the top connector; and
   a package material layer, disposed on the fourth dielectric layer or the top connector, wherein the electronic component is embedded in the packaging material layer.

10. A redistribution layer structure, comprising:
    a first redistribution layer, comprising:
       a first metal layer; and
       a first dielectric layer, disposed on the first metal layer;
    a second redistribution layer, disposed on the first redistribution layer, comprising:
       a second metal layer, disposed on the first dielectric layer; and
       a second dielectric layer is disposed on the second metal layer;
    a third redistribution layer, disposed on the second redistribution layer, comprising:
       a third metal layer, disposed on the second dielectric layer; and
       a third dielectric layer, disposed on the third metal layer; and
    a fourth redistribution layer, disposed on the third redistribution layer, comprising:
       a fourth metal layer, disposed on the third dielectric layer; and
       a fourth dielectric layer, disposed on the fourth metal layer,
    wherein a range of a difference between a coefficient of thermal expansion of the first dielectric layer and a coefficient of thermal expansion of the first metal layer is 0% to 70% of the coefficient of thermal expansion of the first dielectric layer,
    wherein a range of a difference between a coefficient of thermal expansion of the second dielectric layer and a coefficient of thermal expansion of the second metal layer is 0% to 70% of the coefficient of thermal expansion of the second dielectric layer,
    wherein a range of a difference between a coefficient of thermal expansion of the third dielectric layer and a coefficient of thermal expansion of the third metal layer is 0% to 70% of the coefficient of thermal expansion of the third dielectric layer,
    wherein a range of a difference between a coefficient of thermal expansion of the fourth dielectric layer and a coefficient of thermal expansion of the fourth metal layer is 0% to 70% of the coefficient of thermal expansion of the fourth dielectric layer,
    wherein a Young's modulus of the third dielectric layer is less than a Young's modulus of the first dielectric layer.

11. The redistribution layer structure according to claim 10, wherein the range of the difference between the coefficient of thermal expansion of the first dielectric layer and the coefficient of thermal expansion of the first metal layer is 0% to 55% of the coefficient of thermal expansion of the first dielectric layer.

12. The redistribution layer structure according to claim 10, wherein a Young's modulus of the first dielectric layer is 3 GPa to 5 GPa, and the Young's modulus of the second dielectric layer is 3 GPa to 5 GPa.

13. The redistribution layer structure according to claim 10, wherein a thickness of the first dielectric layer is 5 μm to 15 μm, and a thickness of the second dielectric layer is 5 μm to 15 μm.

14. The redistribution layer structure of claim 10, wherein a thickness of the first dielectric layer is equal to a thickness of the third dielectric layer.

15. The redistribution layer structure according to claim 10, wherein a thickness of the first dielectric layer or the second dielectric layer is greater than a thickness of the third dielectric layer or the fourth dielectric layer.

16. A package structure, comprising:
   a substrate; and
   the redistribution layer structure according to claim 11, disposed on the substrate.

17. The package structure according to claim 16, wherein the substrate comprises at least one chip and a molding compound.

* * * * *